US010862071B2

(12) United States Patent
Chang et al.

(10) Patent No.: US 10,862,071 B2
(45) Date of Patent: *Dec. 8, 2020

(54) DISPLAY DEVICE (71) Applicant: Samsung Display Co., Ltd., Yongin-si (KR)

(72) Inventors: Seungwook Chang, Yongin-si (KR); Mugyeom Kim, Yongin-si (KR); Heechang Park, Yongin-si (KR); Younghee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/582,921

(22) Filed: Sep. 25, 2019

(65) Prior Publication Data

US 2020/0020883 A1   Jan. 16, 2020

Related U.S. Application Data (63) Continuation of application No. 14/832,898, filed on Aug. 21, 2015, now Pat. No. 10,454,063.

(30) Foreign Application Priority Data

Dec. 30, 2014 (KR) .................. 10-2014-0194327

(51) Int. Cl.
H01L 51/52 (2006.01)
H01L 51/00 (2006.01)

(52) U.S. Cl.
CPC ...... H01L 51/5253 (2013.01); H01L 51/0096 (2013.01); H01L 51/5256 (2013.01); Y02E 10/549 (2013.01); Y02P 70/521 (2015.11)

(58) Field of Classification Search
CPC ...................................... H01L 51/52
See application file for complete search history.

(56) References Cited

U.S. PATENT DOCUMENTS

| 8,159,127 | B2 | 4/2012 | Izumi |
| 9,190,630 | B2 | 11/2015 | Kim et al. |
| 10,454,063 | B2 * | 10/2019 | Chang ................. H01L 51/0096 |
| 2002/0063502 | A1 | 5/2002 | Wu |
| 2005/0017638 | A1 | 1/2005 | Kim |
| 2005/0248270 | A1 | 11/2005 | Ghosh et al. |
| 2005/0269926 | A1 | 12/2005 | Fukuoka et al. |
| 2012/0307423 | A1 | 12/2012 | Bohn et al. |

(Continued)

FOREIGN PATENT DOCUMENTS

| CN | 101930992 A | 12/2010 |
| CN | 103811530 A | 5/2014 |

(Continued)

Primary Examiner — Lex H Malsawma
Assistant Examiner — Geoffrey H Ida
(74) Attorney, Agent, or Firm — Lewis Roca Rothgerber Christie LLP (57) ABSTRACT A display device includes: a substrate; a display unit on the substrate; a first inorganic layer on the display unit; a first organic layer on an upper portion of the first inorganic layer; a first dam at an edge of the first organic layer; a second dam spaced from the first dam and at an outer area of the first dam with respect to the display unit; and a stress relieving layer between the first dam and the second dam.

20 Claims, 6 Drawing Sheets (56) References Cited

U.S. PATENT DOCUMENTS

| | | |
|---|---|---|
| 2013/0049062 A1 | 2/2013 | Hatano et al. |
| 2013/0127335 A1 | 5/2013 | Chang et al. |
| 2013/0169515 A1 | 7/2013 | Prushinskiy et al. |
| 2014/0132148 A1 | 5/2014 | Jang et al. |
| 2014/0183491 A1 | 7/2014 | Shin et al. |
| 2014/0217397 A1 | 8/2014 | Kwak et al. |
| 2015/0171367 A1 | 6/2015 | Moon |
| 2015/0323711 A1 | 11/2015 | Bessho et al. |

FOREIGN PATENT DOCUMENTS

| | | |
|---|---|---|
| KR | 10-2014-0062376 A | 5/2014 |
| KR | 10-2014-0087630 A | 7/2014 |
| KR | 10-2015-0071538 A | 6/2015 |

\* cited by examiner

DISPLAY DEVICE

CROSS-REFERENCE TO RELATED APPLICATION

This application is a continuation of U.S. patent application Ser. No. 14/832,898, filed Aug. 21, 2015, which claims priority to and the benefit of Korean Patent Application No. 10-2014-0194327, filed on Dec. 30, 2014 in the Korean Intellectual Property Office, the disclosure of both of which is incorporated herein in its entirety by reference.

BACKGROUND

1. Field

One or more embodiments of the present invention relate to a display device.

2. Description of the Related Art

Along with advancements in information technology, the market for display devices, which are media devices for connecting users with information, has expanded. Accordingly, flat panel displays (FPDs), such as liquid crystal displays (LCDs), organic light-emitting display devices, and plasma display panels (PDPs), are widely used.

In such devices, a desire to reduce a dead space region positioned around a display region is increasing.

SUMMARY

One or more exemplary embodiments of the present invention include a display device.

Additional aspects will be set forth, in part, in the description which follows and, in part, will be apparent from the description or may be learned by practice of the presented embodiments.

According to one or more embodiments of the present invention, a display device includes a substrate; a display unit on the substrate; a first inorganic layer on the display unit; a first organic layer on an upper surface of the first inorganic layer; a first dam at an edge of the first organic layer; a second dam spaced from the first dam and at an outer region of the first dam with respect to the display unit; and a stress relieving layer between the first dam and the second dam.

The stress relieving layer may include an organic material.

The stress relieving layer may include the same material as that of the first organic layer.

The stress relieving layer may be formed using an inkjet process.

The stress relieving layer may be located above the first dam and the second dam and may have a height substantially equal to a height of the first organic layer.

The display device may further include: a second inorganic layer on an upper surface of the first organic layer.

The display device may further include: a protection film below the substrate.

The protection film may be spaced from a display area and may be inside a display area of the display device.

An upper edge of the protection film may be rounded.

The substrate may have a notch, and the notch may be spaced from the edge of the protection film.

The notch may have a triangular shape.

The notch may have a semicircular shape.

The notch may have a rectangular shape.

The stress relieving layer may be between an ELVSS and the second dam.

According to one or more embodiments of the present invention, a display device includes: a substrate; a display unit on the substrate; a first inorganic layer on the display unit; a first organic layer on an upper surface of the first inorganic layer; a first dam at an edge of the first organic layer; and a stress relieving layer on the substrate at an outer area of the first dam with respect to the display unit.

The display device may further include: a second dam spaced from the first dam and at an edge of the stress relieving layer.

The display device may further include: a protection film below the substrate.

The protection film may be have a rounded upper edge.

The substrate may have a notch at a lower surface, and the notch may be spaced from the edge of the protection film.

According to one or more embodiments of the present invention, a display device includes: a substrate; a display unit on the substrate; a first inorganic layer on the display unit; a first organic layer on an upper surface of the first inorganic layer; a first dam at an edge of the first organic layer; and a protection film below the substrate, wherein the protection film has a rounded upper edge.

The display device may further include: a second dam spaced from the first dam and at an outer region of the first dam with respect to the display unit.

The display device may further include: a stress relieving layer between an ELVSS and a second dam at an outer region of the ELVSS with respect to the display unit.

The stress relieving layer may include an organic material.

The stress relieving layer may include the same material as that of the first organic layer.

The stress relieving layer may be formed using an inkjet process.

The substrate may have a notch in a lower surface of the substrate, and the notch may be spaced from the edge of the protection film.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

As the present invention allows for various changes and numerous embodiments, exemplary embodiments will be illustrated in the drawings and described in detail in the written description. Hereinafter, aspects and features of the present invention and a method for accomplishing them will be described more fully with reference to the accompanying drawings, in which exemplary embodiments of the invention are shown. This invention may, however, be embodied in many different forms and should not be construed as limited to the exemplary embodiments set forth herein.

Example embodiments of the invention will be described below, in detail, with reference to the accompanying drawings. Those components that are the same or are substantially similar are indicated by the same reference numeral regardless of the figure number and redundant explanations thereof may be omitted.

It will be understood that although the terms "first", "second", etc. may be used herein to describe various elements, components, regions, layers, or sections, these components should not be limited by these terms. These terms are only used to distinguish one element, component, region, layer, or section from another. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. As used herein, the terms "use," "using," and "used" may be considered synonymous with the terms "utilize," "utilizing," and "utilized," respectively.

As used herein, the singular forms "a" and "an" are intended to include the plural forms as well, unless the context clearly indicates otherwise.

It will be further understood that the terms "includes," "including," "comprises," and/or "comprising" used herein specify the presence of stated features or components but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present. When an element is referred to as being "directly formed on" another element or layer, there are no intervening elements or layers present. It will be understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Sizes of elements in the drawings may be exaggerated for convenience of explanation. In other words, because sizes and thicknesses of components in the drawings may be arbitrarily illustrated for convenience of explanation, the following embodiments are not limited thereto.

Although certain embodiments may be described in a certain process order, a specific process order may be performed differently from the described order. For example, two consecutively described processes may be performed substantially at the same time (e.g., concurrently or simultaneously) or may be performed in an order opposite to the described order.

As used herein, the term "and/or" includes any and all combinations of one or more of the associated listed items. Expressions, such as "at least one of," when preceding a list of elements, modify the entire list of elements and do not modify the individual elements of the list. Also, the term "exemplary" is intended to refer to an example or illustration.

Figure 1:
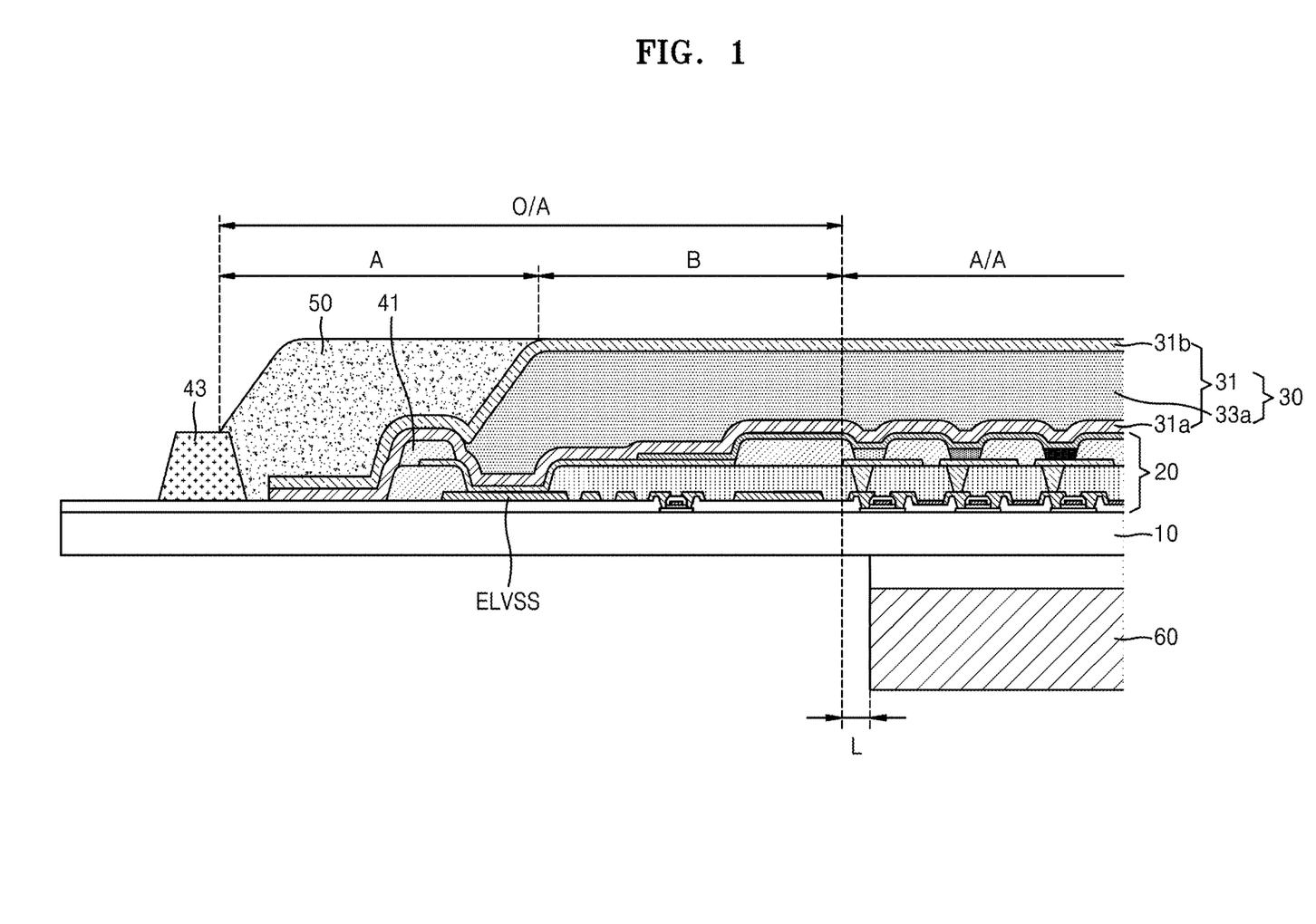
FIG. 1 is a cross-sectional view of a display device according to an embodiment of the present invention.
Figure 2:
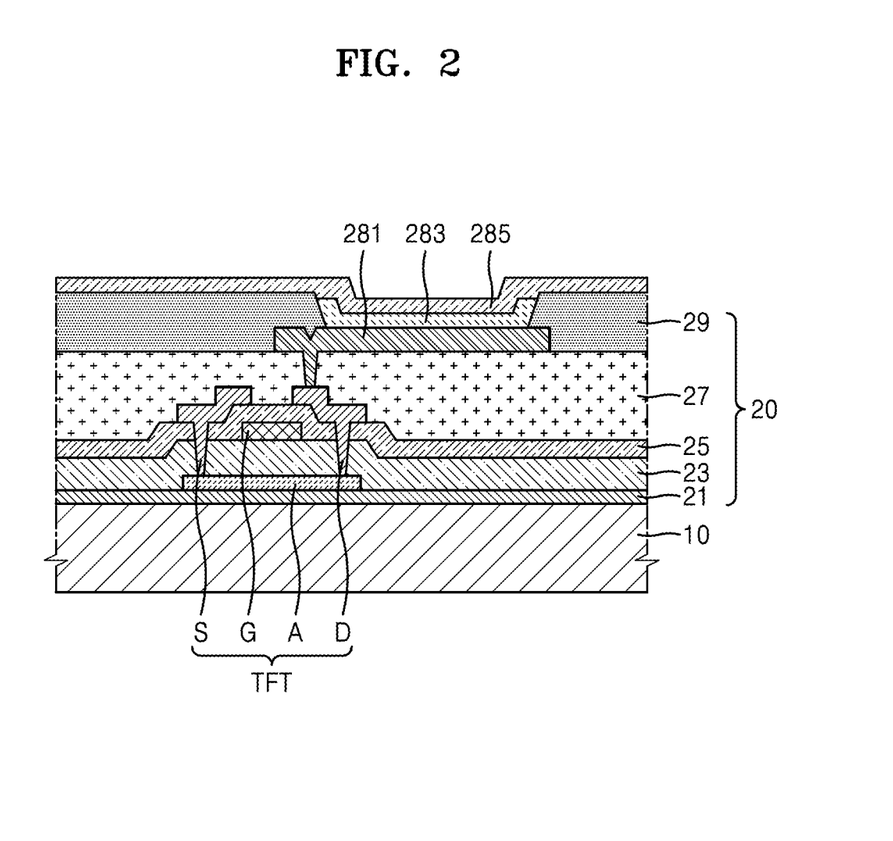
FIG. 2 is a cross-sectional view of a display unit according to an embodiment of the present invention.

FIG. 1 is a cross-sectional view of a display device according to an embodiment of the present invention. FIG. 2 is a cross-sectional view of a display unit 20 according to an embodiment of the present invention.

Referring to FIG. 1, the display device according to an embodiment of the present invention may include a substrate 10, the display unit 20, and an encapsulation unit 30.

The substrate 10 may be formed of a transparent glass material containing, for example, $SiO_2$ as a main component. However, the material used to form the substrate 10 is not limited thereto, and the substrate 10 may be formed of a transparent plastic material, for example, polyimide (PI).

An array of pixels (or sub-pixels) may be formed in a display area A/A of the display unit 20 formed on the substrate 10. Each of the pixels may include a thin film transistor and a light-emitting device controlled by the thin film transistor. The light-emitting device may be a self-emissive-type device, for example, an organic light-emitting device.

Only an embodiment in which the display unit 20 is configured as the organic light-emitting device will be described below for convenience of description, but the present invention is not limited thereto.

The display unit 20 will now be described with reference to FIG. 2.

As shown in FIG. 2, in the display device according to the present embodiment, a buffer layer 21 may be formed on the substrate 10. The buffer layer 21 may act as a barrier layer and/or a blocking layer for reducing or preventing diffusion of impurity ions and penetration of moisture or external air and for planarizing a surface of the substrate 10.

A semiconductor layer A of a thin film transistor TFT is formed on the buffer layer 21. The semiconductor layer A may be formed of polysilicon and may include a channel region undoped with impurities (e.g., not doped) and a source region and a drain region which are each doped with impurities at respective sides of the channel region. The impurities may vary depending on the type of the thin film transistor TFT and may be N-type impurities or P-type impurities.

The semiconductor layer A may be formed of a semiconductor including amorphous silicon or crystal silicon and may be deposited using various deposition methods. For example, the crystal silicon may be formed by crystallizing the amorphous silicon. The amorphous silicon may be crystallized using various methods, such as rapid thermal annealing (RTA), solid phase crystallization (SPC), excimer laser annealing (ELA), metal induced crystallization (MIC), metal induced lateral crystallization (MILC), and/or sequential lateral solidification (SLS). The semiconductor layer A may be patterned by photolithography.

A gate insulating layer 23 is deposited on the surface (e.g., the entire surface) of the substrate 10 such that the gate insulating layer 23 may cover the semiconductor layer A. The gate insulating layer 23 may be formed of an inorganic material, such as silicon oxide or silicon nitride, and as a multi-layer or as a single-layer structure. In some embodiments, the gate insulating layer 23 may be formed of silicon nitride ($SiN_x$), silicon oxide ($SiO_2$), hafnium (Hf) oxide, and/or aluminum oxide. The gate insulating layer 23 may be formed using various deposition methods, such as Chemical Vapour Deposition (CVD) and/or Plasma Enhanced Chemical Vapour Deposition (PECVD). The gate insulating layer 23 insulates the semiconductor layer A from a gate electrode G.

The gate electrode G may be formed of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tungsten (W), and/or copper (Cu).

An interlayer insulating layer 25 is formed on the surface (e.g., the entire surface) of the substrate 10 such that the interlayer insulating layer 25 may cover the gate electrode G.

The interlayer insulating layer 25 may be formed of an inorganic material or an organic material. In some embodiments, the interlayer insulating layer 25 may be formed of an inorganic material. For example, the interlayer insulating layer 25 may be formed of metal oxide or metal nitride. The inorganic material may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like. The interlayer insulating layer 25 may be formed of an inorganic material, such as silicon oxide ($SiO_x$) and/or silicon nitride ($SiN_x$) and as a multi-layer or a single-layer structure. In some embodiments, the interlayer insulating layer 25 may have a stacked structure of $SiO_x$/$SiN_y$ or $SiN_x$/$SiO_y$. The interlayer insulating layer 25 may be formed using various deposition methods, such as CVD and PECVD.

The interlayer insulating layer 25 may insulate the gate electrode G from wirings formed on an upper surface of the interlayer insulating layer 25.

A source electrode S and a drain electrode D of the thin film transistor TFT are formed on the interlayer insulating layer 25.

A planarization layer 27 is formed on the entire surface of the substrate 10 such that the planarization layer 27 may cover the source electrode S and the drain electrode D. A pixel electrode 281 may be formed on the planarization layer 27. The pixel electrode 281 is connected to the drain electrode D of the thin film transistor TFT through an opening VIA (e.g., a via hole).

The planarization layer 27 may be formed of an insulating material. For example, the planarization layer 27 may be formed of an inorganic material, an organic material, or a compound including the organic/inorganic materials. The planarization layer 27 may be formed as a multi-layer or a single-layer structure and may be formed using various deposition methods. In some embodiments, the planarization layer 27 may be formed of polyacrylate resin, epoxy resin, phenolic resin, polyamides resin, polyimide resin, unsaturated polyester resin, polyphenylene ether resin, polyphenylene sulfide resin, and/or benzocyclobutene (BCB).

An organic light-emitting device (OLED) may be formed on the thin film transistor TFT. The OLED includes the pixel electrode 281, an intermediate layer 283 including an organic emission layer, and an opposite electrode 285. The OLED may further include a pixel defining layer 29 and a spacer.

The pixel electrode 281 may be electrically connected to the drain electrode D of the thin film transistor TFT while filling the opening VIA in the planarization layer 27. The pixel electrode 281 and/or the opposite electrode 285 may be formed as a transparent electrode or as a reflective electrode. When the pixel electrode 281 and/or the opposite electrode 285 are formed as transparent electrodes, the pixel electrode 281 and/or the opposite electrode 285 may be formed of indium tin oxide (ITO), indium zinc oxide (IZO), zinc oxide (ZnO), and/or indium oxide ($In_2O_3$). When the pixel electrode 281 and/or the opposite electrode 285 are formed as reflective electrodes, the pixel electrode 281 and/or the opposite electrode 285 may include a reflective layer that is formed of silver (Ag), magnesium (Mg), aluminum (Al), platinum (Pt), palladium (Pd), gold (Au), nickel (Ni), neodymium (Nd), iridium (Ir), chromium (Cr), or a suitable combination thereof, and a transparent layer that is formed of ITO, IZO, ZnO, and/or $In_2O_3$. In some embodiments, the pixel electrode 281 or the opposite electrode 285 may have an ITO/Ag/ITO structure.

The pixel defining layer 29 may define a pixel region and a non-pixel region. The pixel defining layer 29 may include an aperture exposing the pixel electrode 281 and may be formed to cover the surface (e.g., the entire surface) of the substrate 10. The intermediate layer 283, which will be further described later, may be formed in the aperture, and thus, the aperture may define the entire or substantially the entire pixel region.

The intermediate layer 283 may include an organic emission layer. In one embodiment, the intermediate layer 283 includes the organic emission layer. The intermediate layer 283 may further include a hole injection layer (HIL), a hole transport layer (HTL), an electron transport layer (ETL), and/or an electron injection layer (EIL). The present invention is not limited thereto, and the intermediate layer 283 may further include the other functional layers in addition to an organic emission layer.

The pixel electrode 281, the intermediate layer 283, and the opposite electrode 285 together form (e.g., constitute) an organic light-emitting diode (OLED). Holes and electrons respectively injected from the pixel electrode 281 and the opposite electrode 285 of the OLED may combine with each other in the organic emission layer of the intermediate layer 283 to thereby generate light.

The HIL may be formed of a phthalocyanine compound, such as copper phthalocyanine, or TCTA, m-MTDATA, or m-MTDAPB which is a star-bust type amine.

The HTL may be formed of N,N'-bis(3-methylphenyl)-N,N'-diphenyl-[1,1-biphenyl]-4,4'-diamine (TPD), N,N'-di (naphthalene-1-yl)-N,N'-diphenyl benzidine (α-NPD), etc.

The EIL may be formed of a material such as LiF, NaCl, CsF, $Li_2O$, BaO, or Liq.

The ETL may be formed of $Alq_3$.

The organic emission layer may include a host material and a dopant material. Examples of the host material of the organic emission layer may include tris (8-hydroxyquinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis 9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), and the like.

Examples of the dopant material of the organic emission layer may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), and the like.

The opposite electrode 285 is formed on the intermediate layer 283. The opposite electrode 285 forms an electric field together with the pixel electrode 281 so that light is emitted by the intermediate layer 283. The pixel electrode 281 may be patterned for each pixel, and the opposite electrode 285 may be formed so that a common voltage is applied to all of the pixels.

The pixel electrode 281 and the opposite electrode 285 may be formed as transparent electrodes or as reflective electrodes, or the pixel electrode 281 and the opposite electrode 285 may separately be formed as a transparent electrode and a reflective electrode. The pixel electrode 281 may function as an anode and the opposite electrode 285 may function as a cathode, but the present invention is not limited thereto. For example, the pixel electrode 281 may function as a cathode, and the opposite electrode 285 may function as an anode.

Although only one OLED is illustrated in FIG. 1, a display panel may include a plurality of OLEDs. One pixel may be formed in each of the OLEDs. Each pixel may implement (e.g., output) a red color, a green color, a blue color, or a white color.

However, the present invention is not limited thereto. The intermediate layer 283 may be commonly formed on the entire pixel electrode 281 irrespective of locations of pixels. In this embodiment, the organic emission layer may be formed by stacking a light-emitting substance for emitting (e.g., configured to emit) a red light, a light-emitting substance for emitting a green light, and a light-emitting substance for emitting a blue light vertically or by mixing them. Any suitable combination of other colors which is capable of emitting a white light is possible. The organic emission layer may further include a color converting layer that coverts the white light into a light having a certain (e.g., predetermined) color or a color filter.

A protection layer may be disposed on the opposite electrode 285 and may cover and protect the OLED. An inorganic insulation layer and/or an organic insulation layer may be used as the protection layer.

The spacer may be disposed between pixel regions in a display region DA. The spacer may be provided to maintain an interval between the substrate 10 and the encapsulation unit 30 and to prevent display characteristics from being degraded by external impacts.

The spacer may be provided on the pixel defining layer 29. The spacer may protrude from the pixel defining layer 29 toward the encapsulation unit 30.

In some embodiments, the spacer may be formed of the same material as the material used to form the pixel defining layer 29 and by using the same process as the process used to form the pixel defining layer 29. For example, the pixel defining layer 29 and the spacer may be concurrently (e.g., simultaneously) formed by adjusting an amount of exposure by using a halftone mask during an exposure process. However, the present invention is not limited thereto. The pixel defining layer 29 and the spacer may be sequentially or separately formed and may be independent structures formed of different materials.

The display device according to the present embodiment will now be described with reference to FIG. 1.

As shown in FIG. 1, the display device according to the present embodiment may be divided into the display area A/A in which the display unit 20 emits light and an outer area O/A that is a remaining region (e.g., a region other than the display area A/A) of the display device.

The display unit 20 may be provided in the display area A/A as shown in FIG. 1. The encapsulation unit 30 may be formed on the substrate 10 throughout the display area A/A and the outer area O/A such that the encapsulation unit 30 may cover the display unit 20.

The encapsulation unit 30 has a structure in which a plurality of thin film layers are stacked, such as a structure in which an inorganic layer 31 and an organic layer 33 are alternately stacked.

Although a first inorganic layer 31a, a first organic layer 33a, and a second inorganic layer 31b are sequentially stacked on the display unit 20 in FIG. 1, the number of thin film layers is not limited thereto. The encapsulation unit 30 may be formed without restriction of the number of thin film layers as long as the encapsulation unit 30 has the structure in which the inorganic layer 31 and the organic layer 33 are alternately stacked.

The inorganic layer 31 may strongly prevent penetration of oxygen or moisture to the display unit 20, and the organic layer 33 may absorb stress applied to the inorganic layer 31 to enhance flexibility.

The inorganic layer 31 may be a single layer or a multi-layer stack including metal oxide and/or metal nitride. For example, the first and second inorganic layers 31a and 31b may include $SiN_x$, $Al_2O_3$, $SiO_2$, and/or $TiO_2$.

The organic layer 33 is formed of a polymer and may be a single layer or a multi-layer stack formed of, for example, polyethylene terephthalate, polyimide, polycarbonate, epoxy, polyethylene, and/or polyacrylate. For example, the organic layer 33 may be formed of polyacrylate. For example, the organic layer 33 may include a result of (e.g., may be formed by) polymerizing a monomer composition including a diacrylate-based monomer and/or a triacrylate-based monomer. The monomer composition may further include a monoacrylate-based monomer. The monomer composition may further include a well-known photoinitiator, such as trimethyl benzoyl diphenyl phosphine oxide (TPO), but the present invention is not limited thereto.

As shown in FIG. 1, a first dam 41 may be formed in the outer area O/A of the substrate 10. The first dam 41 may be formed at an edge of the first organic layer 33a and may be formed to have a height (e.g., a predetermined height) to prevent the first organic layer 33a from unintendedly spreading when the first organic layer 33a is formed (e.g., the first dam 41 may be formed to contain the first organic layer 33a when the first organic layer 33a is formed).

In some embodiments, the first dam 41 may be formed of the same material as that of the pixel defining layer 29 and formed during the same process as used to form the pixel defining layer 29. For example, the pixel defining layer 29 and the first dam 41 may be concurrently (e.g., simultaneously) formed by adjusting an amount of exposure through an exposure process by using a halftone mask, but the present invention is not limited thereto.

The first dam 41 may be formed on an upper portion of an ELVSS. As shown in FIG. 1, the first dam 41 may be formed toward the outside of the upper portion of the ELVSS.

The first and second inorganic layers 31a and 31b may be formed on a portion of the substrate 10 to cover the first dam 41. The first organic layer 33a may be formed at the inside of the display area A/A and the outer area O/A in which the first dam 41 is formed.

In one embodiment, the outer area O/A may be divided into an inner unit B (e.g., an inner portion) in which the first organic layer 33a is formed and an outer unit A (e.g., an outer portion) in which the first dam 41 is formed and the first organic layer 33a is not formed. Because the layers in the inner unit B are deposited in such a manner that an organic layer has a uniform or substantially uniform thickness, although stress is applied to the inner unit B during a process of bending the outer area O/A, the stress is absorbed by the organic layer and, thus, flexibility may be securely provided to the inner unit B.

When a structure like the first organic layer 33a is not formed in the outer unit A, stress may be wholly absorbed during the bending process, and accordingly, a crack may occur due to a tensile stress difference between the inner unit B and the outer unit A.

For example, an outer region of the display area A/A may be bent to form a dead space D/S, and the entire the outer unit A and the inner unit B, in other words, the entire outer area O/A, may be bent to minimize formation of the dead space D/S.

During the process, stress is applied to a substrate and upper elements or layers thereon due to the bending. Thus, there may be a difference in the stress applied to the inner unit B in which the organic layer is formed and the outer unit A in which the organic layer is not formed. As described above, the organic layer may act to absorb stress and ensure flexibility.

Therefore, if the formation of the dead space D/S is minimized, there is a concern that the crack may occur due to the stress difference between the inner unit B and the outer unit A. If a region in which the dead space D/S is formed increases to reduce a chance of the crack occurring, a size of the display device may be undesirably increased.

The display device according to the present embodiment may include a second dam 43 and a stress relieving layer 50 as shown in FIG. 1, which will be further described in detail below.

The display device according to the present embodiment may further include the second dam 43 spaced from (e.g., spaced apart from) the first dam 41 (e.g., spaced by a predetermined distance) and provided at an outer region of the first dam 41 (e.g., an outer region of the first dam 41 with respect to the display unit 20).

The second dam 43 may be formed at edges of the first inorganic layer 31a and the second organic layer 31b as shown in FIG. 1.

In some embodiments, the second dam 43 may be formed of the same material as that of the first dam 41 and through the same process as used to form the first dam 41. However, the present invention is not limited thereto.

The stress relieving layer 50 has a certain height and may be formed in a space (e.g., an area) between the first dam 41 and the second dam 43 (e.g., in the outer unit A).

The stress relieving layer 50 may be formed of an organic material and may be formed by being deposited to have the same or substantially the same height as that of the first organic layer 33a but is not limited thereto.

The stress relieving layer 50 is formed of a polymer and may be a single layer or a multi-layer stack formed of, for example, polyethylene terephthalate, polyimide, polycarbonate, epoxy, polyethylene, and/or polyacrylate. For example, the stress relieving layer 50 may be formed of polyacrylate. For example, the stress relieving layer 50 may include a result of (e.g., may be formed by) polymerizing a monomer composition including a diacrylate-based monomer and/or a triacrylate-based monomer. The monomer composition may further include a monoacrylate-based monomer, but the present invention is not limited thereto.

The stress relieving layer 50 may be formed of the same material as that of the first organic layer 33a and through the same process as used to form the first organic layer 33a.

The second dam 43 may act as a dam to prevent the stress relieving layer 50 from spreading to the outside of the substrate 10 when the stress relieving layer 50 is formed (e.g., the second dam 43 may contain the stress relieving layer 50 when the stress relieving layer 50 is formed).

The stress relieving layer 50 may be formed by using various processing methods. For example, the stress relieving layer 50 may be formed through inkjet processing in order to easily control spreading of at an edge thereof in some embodiments. However, a method of forming the stress relieving layer 50 is not limited thereto.

Thus, in some embodiments, the stress relieving layer 50 may be formed of the same organic material as that of the first organic layer 33a through inkjet processing to be between the first dam 41 and the second dam 43 after forming the second dam 43.

The stress relieving layer 50 may be formed by being deposited to have a certain height like the first organic layer 33a in order to reduce the stress difference between the inner unit B and the outer unit A.

Accordingly, when the outer area O/A is bent, the likelihood of a crack forming may be substantially reduced or prevent because the first organic layer 33a absorbs stress applied to the inner unit B and the stress relieving layer 50 absorbs stress applied to the outer area O/A.

The display device according to the present embodiment may further include a protection film 60 provided below (e.g., at a lower portion or at a lower surface) of the substrate 10. The protection film 60 may protect the display device from an external impact during a manufacturing process and prevent penetration of moisture from the lower portion of the substrate 10.

The protection film 60 may be attached to the lower portion of the substrate 10 by a thin adhesion layer. When the adhesion layer is used to attach the protection film 60 to the lower portion of the substrate 10, twisting of the substrate 10 may be effectively prevented.

The protection film 60 is positioned in the display area A/A. However, the protection film 60 may be positioned inside from an edge of the display area A/A by a certain length L.

The protection film 60 prevents the substrate 10 from being damaged when the substrate 10 is bent.

Figure 3:
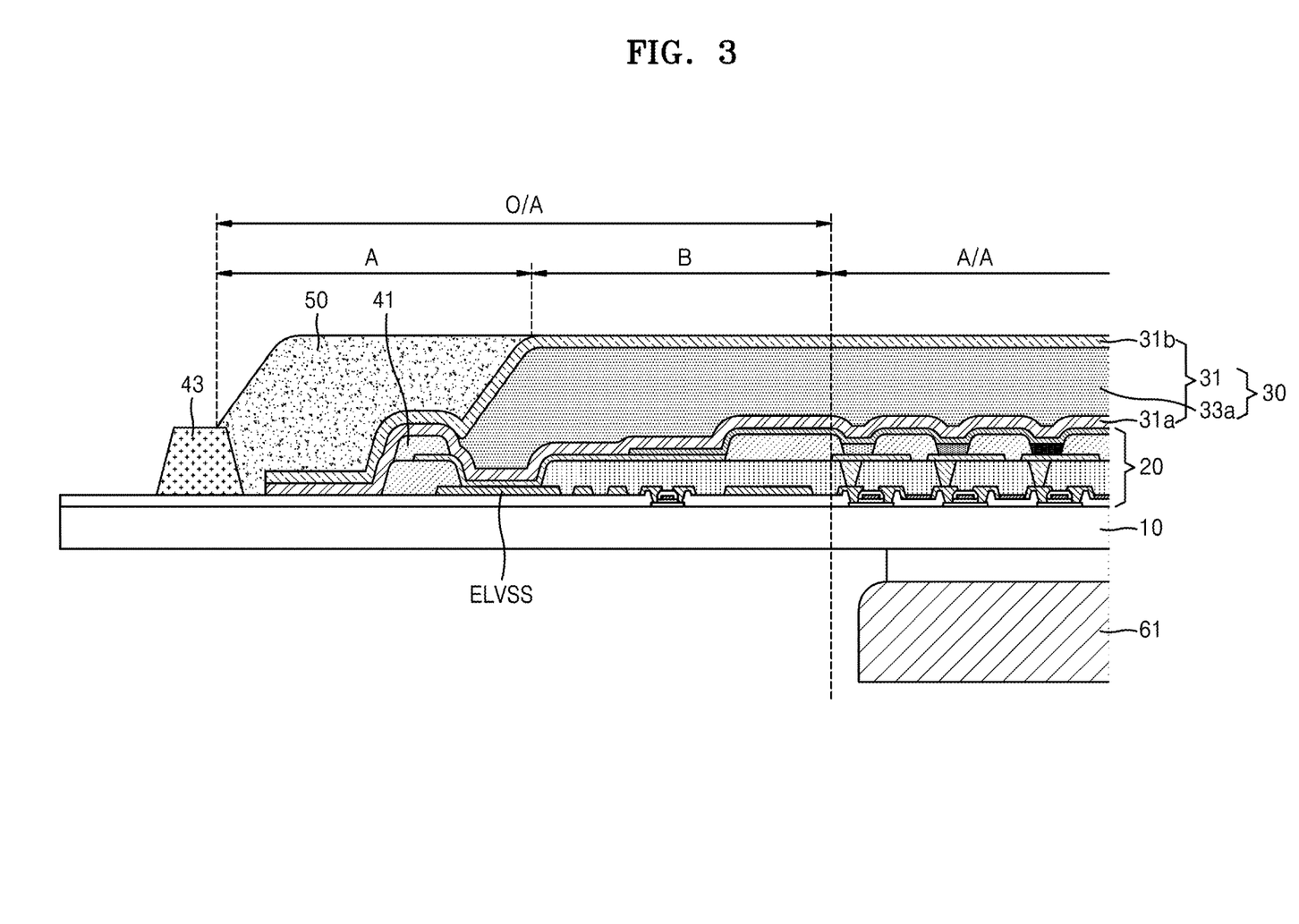
FIG. 3 is a schematic cross-sectional view illustrating a display device according to another embodiment of the present invention.

FIG. 3 is a schematic cross-sectional view illustrating a display device according to another embodiment of the present invention. The same reference numerals between FIGS. 1-3 denote the same elements and, thus, redundant descriptions may be omitted for brevity of description.

Differences between the display device according to the present embodiment and the display device according to an embodiment of FIG. 1 will be primarily described.

As shown in FIG. 3, a protection film 61 may be provided below (e.g., at a lower portion) of the substrate 10 in the display device according to the present embodiment.

In one embodiment, the protection film 61 may be formed having a rounded upper edge.

During a process of bending the substrate 10, compressive stress is applied to the lower portion of the substrate 10 due to contraction and tensile stress is applied to an upper portion of the protection film 61 due to expansion.

During a process of manufacturing the display device, a bending process may be repeatedly performed due to an external force, and when stress that is greater than a breaking stress is applied to the display device, the display device may be damaged.

In one embodiment, the rounded upper edge of the protection film 61 may be formed to relieve stress that occurs in the lower portion of the substrate 10 and the upper portion of the protection film 61.

Figure 4:
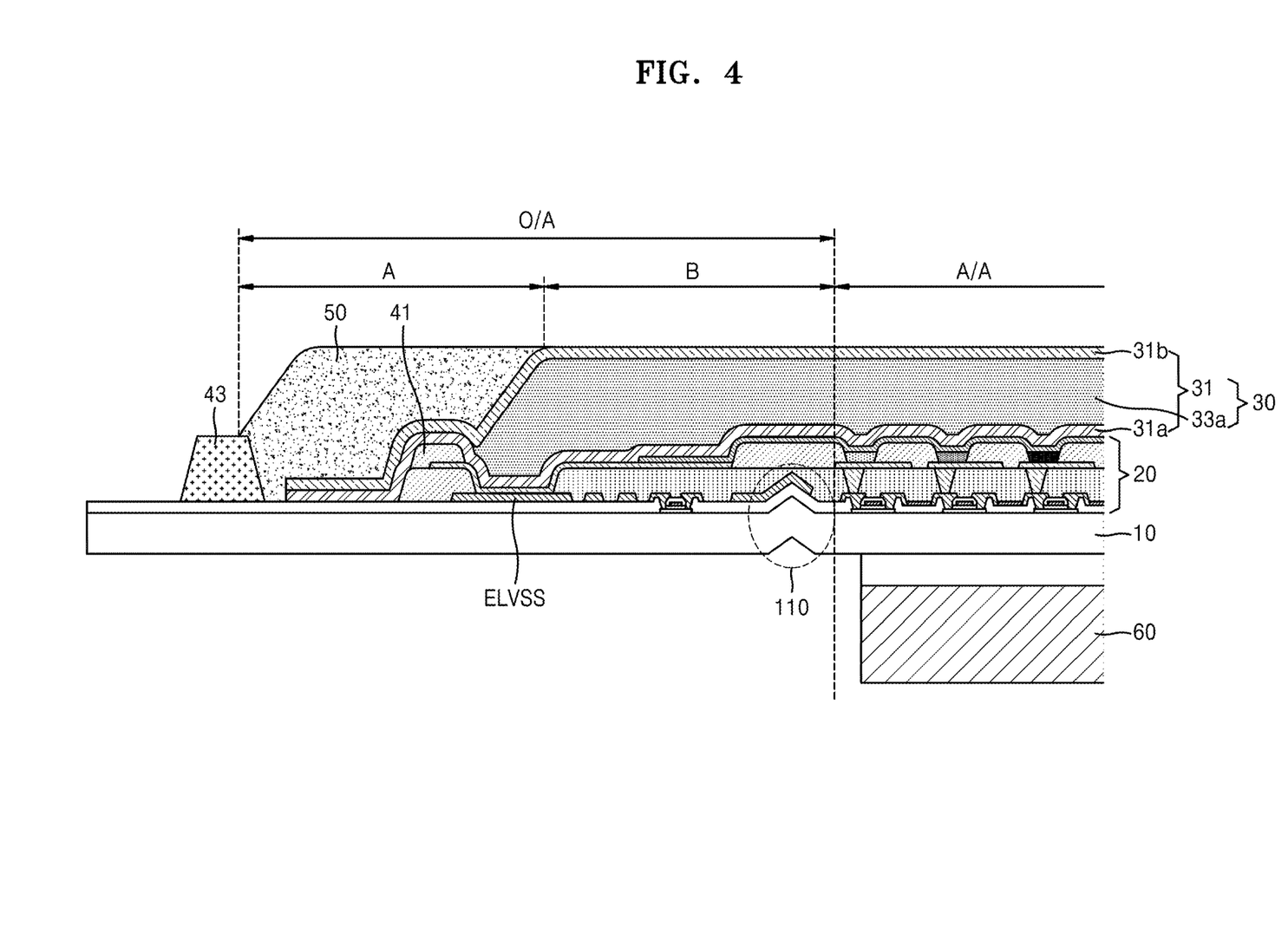
FIG. 4 is a schematic cross-sectional view illustrating a display device according to another embodiment of the present invention.

FIG. 4 is a schematic cross-sectional view illustrating a display device according to another embodiment of the present invention. The same reference numerals between FIGS. 1-4 denote the same elements and, thus, redundant descriptions may be omitted for brevity of description.

As shown in FIG. 4, a notch 110 (e.g., a notch unit) may be formed in a lower surface of the substrate 10 of the display device according to some embodiments of the present invention.

As described above, during a process of manufacturing the display device, compressive stress is applied to the lower portion of the substrate 10 due to contraction. To remove or reduce the compressive stress, the display device may have the notch 110 in the lower portion of the substrate 10.

The notch 110 may be formed in the lower surface of the substrate 10 in the form of a groove having a certain height and width. The height and width of the notch 110 are not limited, and a shape of the notch 110 is not also limited to the illustrated shape.

The notch 110 may be formed in the lower surface of the substrate 10 and may be formed in a region to which compressive stress is most applied or concentrated. Because the notch 110, that is, the groove having a certain shape, is formed in the lower surface of the substrate 10, although a bending process is performed, compressive stress applied to the lower surface of the substrate 10 may be reduced. As a result, the display device is prevented from being damaged.

The notch 110 having a triangular shape may be formed in the lower surface of the substrate 10 of the display device according to the present embodiment. A width and a height of the notch 110 may have various values according to an anticipated bending degree but are not limited thereto. However, the height of the notch 110 may have a smaller value than that of the thickness of the substrate 10.

Figure 5:
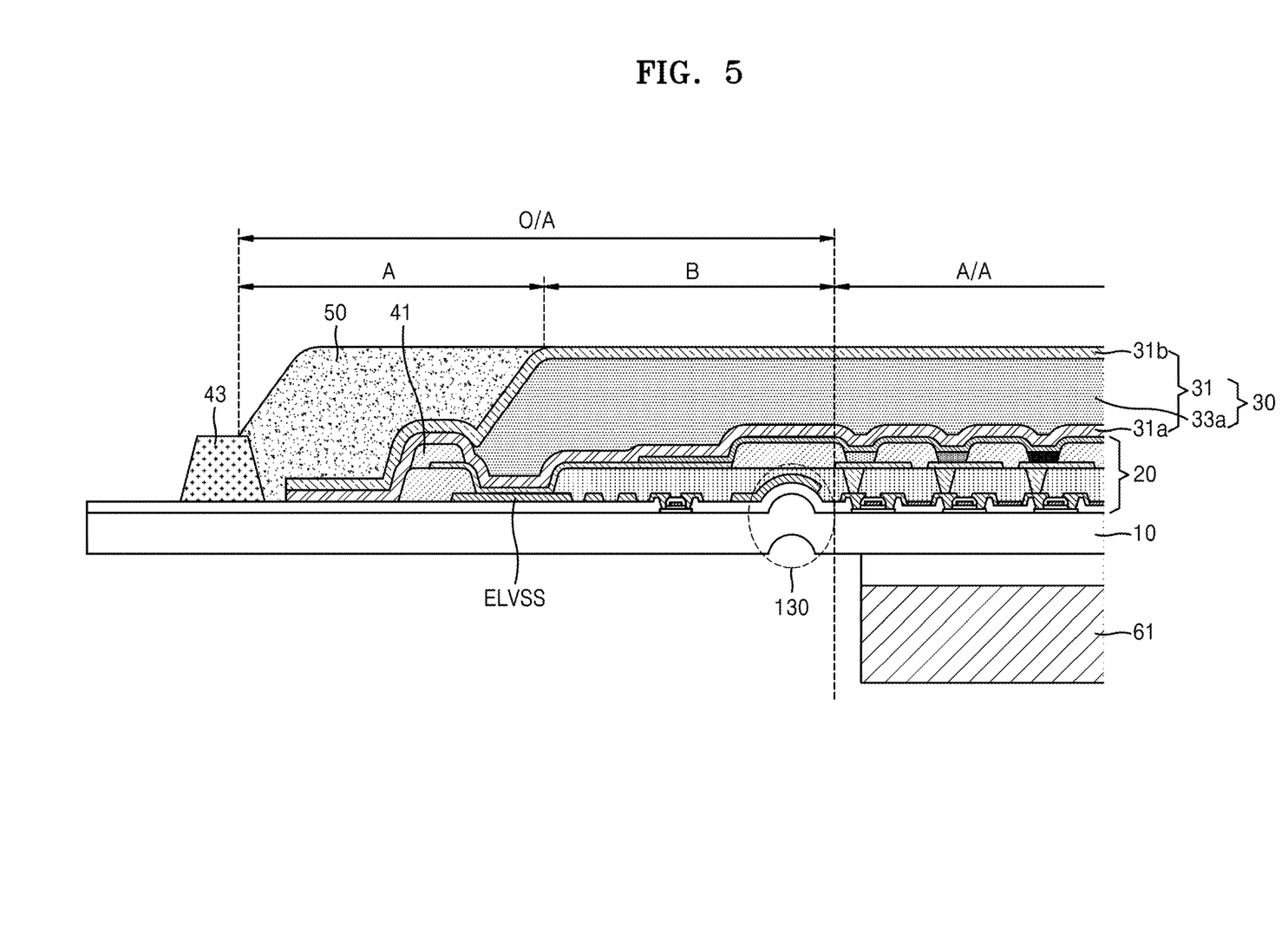
FIG. 5 is a schematic cross-sectional view illustrating a display device according to another embodiment of the present invention.

FIG. 5 is a schematic cross-sectional view illustrating a display device according to another embodiment of the present invention. The same reference numerals between FIGS. 1-3 and 5 denote the same elements and, thus, redundant descriptions may be omitted for brevity of description.

The display device according to the present embodiment is primarily different from the display device according to the embodiment of FIG. 4 in that a notch 130 has a different shape than the notch 110 of FIG. 4, and thus, differences between these embodiments will be primarily described for convenience of description.

As shown in FIG. 5, the display device according to the present embodiment may be formed such that the notch 130 formed in the lower surface of the substrate 10 has a circular shape (e.g., a semicircular shape).

A radius of the notch 130 having the circular shape may have various values according to an anticipated bending degree but is not limited thereto. The radius of the notch 130 may have a smaller value than that of the thickness of the substrate 10.

The notch 130 may be formed in the lower surface of the substrate 10 and may be formed in a region to which compressive stress is most applied or concentrated. Because the notch 130, that is, a groove having a certain shape, is formed in the lower surface of the substrate 10, although a bending process is performed, compressive stress applied to the lower surface of the substrate 10 may be reduced. As a result, the display device is prevented from being damaged.

Figure 6:
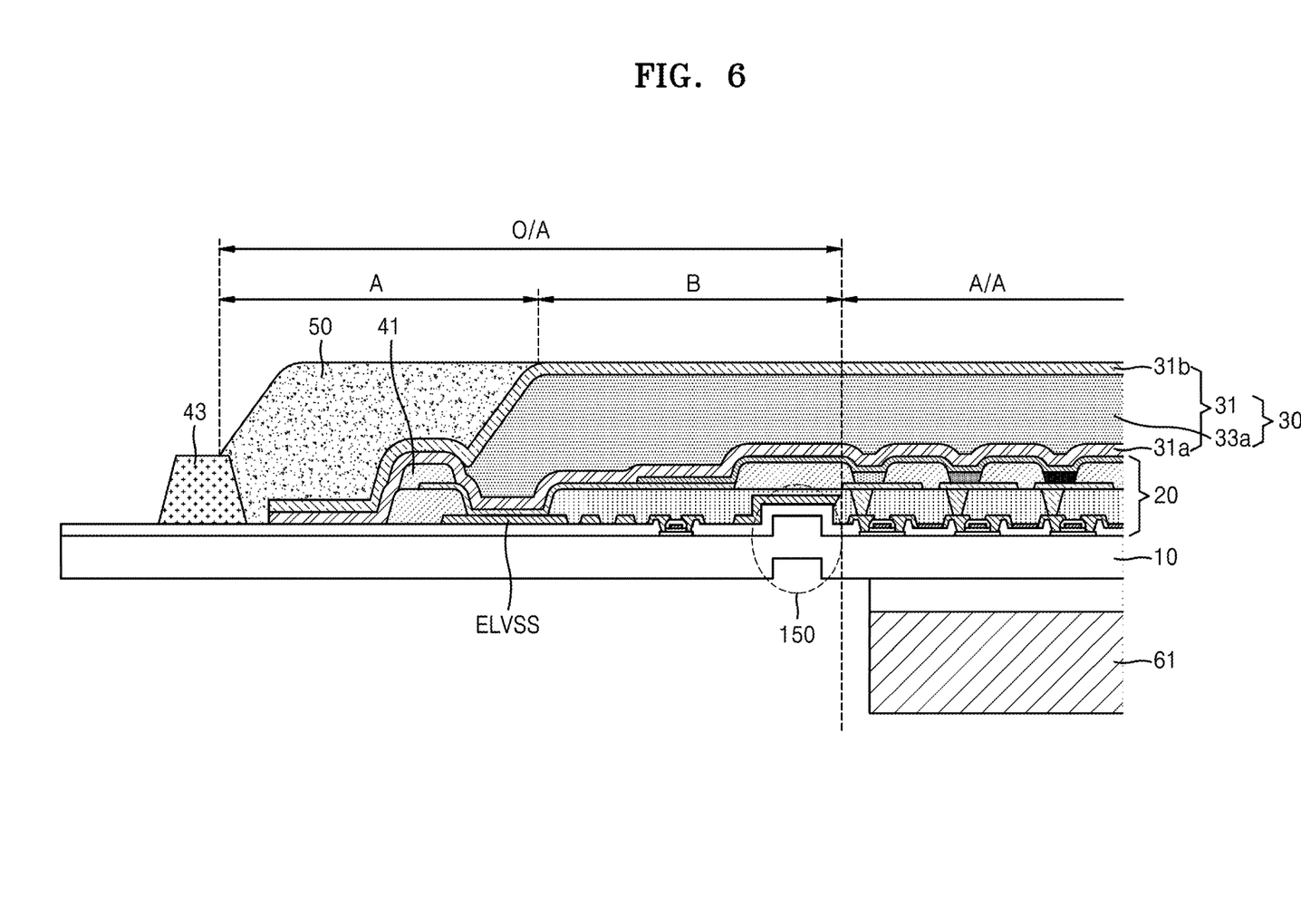
FIG. 6 is a schematic cross-sectional view illustrating a display device according to another embodiment of the present invention.

FIG. 6 is a schematic cross-sectional view illustrating a display device according to another embodiment of the present invention. The same reference numerals between FIGS. 1-3 and 6 denote the same elements and, thus, redundant descriptions may be omitted for brevity of description.

The display device according to the present embodiment is primarily different from the display device according to the embodiment of FIG. 4 in that a notch 150 has a shape different from the notch 110, and thus, differences between these embodiments will be primarily described for convenience of description.

As shown in FIG. 6, the display device according to the present embodiment may be formed such that the notch 150 having a rectangular shape is formed in the lower surface of the substrate 10.

A width and a height of the notch 150 having the rectangular shape may have various values according to an anticipated bending degree but are not limited thereto. However, the height of the notch 150 may have a smaller value than that of the thickness of the substrate 10.

The notch 150 may be formed in the lower surface of the substrate 10 and may be formed in a region to which compressive stress is most applied or concentrated. Because the notch 150, that is, a groove having a certain shape, is formed in the lower surface of the substrate 10, although a bending process is performed, compressive stress applied to the lower surface of the substrate 10 may be reduced. As a result, the display device is prevented from being damaged.

As described above, according to the one or more of the above-described embodiments of the present invention, a dead space region of a display device is reduced or minimized while a crack is prevented from forming in a substrate.

It should be understood that the exemplary embodiments described herein should be considered in a descriptive sense only and not for purposes of limitation. Descriptions of features or aspects within each embodiment should typically be considered as available for other similar features or aspects in other embodiments unless specifically indicated otherwise.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A display device comprising:
   a substrate;
   a display unit on the substrate and configured to emit light;
   a first inorganic layer encapsulating the display unit;
   a first organic layer on the first inorganic layer;
   a second inorganic layer on the first organic layer, the second inorganic layer directly contacting the first inorganic layer outside of the first organic layer;
   a first dam overlapping with at least a portion of the first organic layer;
   a second dam spaced from the first dam and at an outer region of the first dam with respect to the display unit; and
   a second organic layer between the first dam and the second dam, the first inorganic layer and the second inorganic layer overlapping with the first dam and extending toward the second dam, the second organic layer being on the first inorganic layer.

2. The display device of claim 1, wherein the second organic layer comprises an organic material.

3. The display device of claim 1, wherein the second organic layer comprises the same material as that of the first organic layer.

4. The display device of claim 1, wherein the second organic layer is formed using an inkjet process.

5. The display device of claim 1, wherein the second organic layer is located above the first dam.

6. The display device of claim 1, further comprising a protection film below the substrate.

7. The display device of claim 6, wherein the protection film is spaced from a display area and is inside a display area of the display device.

8. The display device of claim 6, wherein an upper edge of the protection film is rounded.

9. The display device of claim 6, wherein the substrate has a notch, and
   wherein the notch is spaced from an edge of the protection film.

10. The display device of claim 1, wherein the second organic layer is between an ELVSS and the second dam.

11. The display device of claim 10, wherein the first dam overlaps with an upper portion of the ELVSS.

12. A display device comprising:
    a substrate;
    a display unit on the substrate, the display unit comprising a pixel electrode, a pixel defining layer over the pixel electrode and having an opening exposing a portion of the pixel electrode, an intermediate layer on the pixel electrode, and an opposite electrode on the intermediate layer and the pixel defining layer;
    a first inorganic layer over the substrate and on the display unit;
    a first organic layer on the first inorganic layer;
    a second inorganic layer on the first organic layer, the second inorganic layer directly contacting the first inorganic layer outside of the first organic layer;
    a first dam overlapping with at least a portion of the first organic layer, the first inorganic layer overlapping with the first dam; and
    a second organic layer on the substrate at an outer area of the first dam with respect to the display unit, the second organic layer being over the first inorganic layer.

13. The display device of claim 12, further comprising:
    a second dam spaced from the first dam and at an edge of the second organic layer.

14. The display device of claim 12, further comprising:
    a protection film below the substrate.

15. The display device of claim 14, wherein the protection film has a rounded upper edge.

16. The display device of claim 14, wherein the substrate has a notch at a lower surface, and
    wherein the notch is spaced from an edge of the protection film.

17. The display device of claim 12, further comprising:
    a second dam spaced from the first dam and at an outer region of the first dam with respect to the display unit.

18. The display device of claim 17, wherein the second organic layer is located between an ELVSS and the second dam.

19. The display device of claim 12, wherein the second organic layer comprises an organic material.

20. The display device of claim 12, wherein the second organic layer comprises the same material as that of the first organic layer.

* * * * *